United States Patent
Wen et al.

(10) Patent No.: US 12,107,016 B2
(45) Date of Patent: Oct. 1, 2024

(54) DETECTION METHOD OF METAL IMPURITY IN WAFER

(71) Applicant: Zing Semiconductor Corporation, Shanghai (CN)

(72) Inventors: Lanlin Wen, Shanghai (CN); Tian Feng, Shanghai (CN); Zhen Zhou, Shanghai (CN)

(73) Assignee: Zing Semiconductor Corporation, Shanghai (CN)

( * ) Notice: Subject to any disclaimer, the term of this patent is extended or adjusted under 35 U.S.C. 154(b) by 590 days.

(21) Appl. No.: 17/196,116

(22) Filed: Mar. 9, 2021

(65) Prior Publication Data
US 2022/0208617 A1 Jun. 30, 2022

(30) Foreign Application Priority Data
Dec. 28, 2020 (CN) .......................... 202011581016.8

(51) Int. Cl.
*H01L 21/225* (2006.01)
*H01J 49/00* (2006.01)
(Continued)

(52) U.S. Cl.
CPC .......... *H01L 22/10* (2013.01); *H01J 49/0031* (2013.01); *H01J 49/105* (2013.01); *H01L 21/2252* (2013.01); *H01L 22/12* (2013.01)

(58) Field of Classification Search
CPC ..... H01L 22/10; H01L 21/2252; H01L 22/00; H01L 22/20; H01J 49/0031; H01J 49/105
See application file for complete search history.

(56) References Cited

U.S. PATENT DOCUMENTS 6,140,131 A    10/2000  Sunakawa et al.
7,888,265 B2 *  2/2011  Hirano ................ G01N 1/32
                                                    438/692
(Continued)

FOREIGN PATENT DOCUMENTS

CN    1981369 A     6/2007
CN  109904089 A     6/2019
(Continued)

OTHER PUBLICATIONS

Taiwanese Office Action, dated Oct. 20, 2021, in a counterpart Taiwanese patent application, No. TW 110105944.
(Continued)

*Primary Examiner* — Eduardo A Rodela
(74) *Attorney, Agent, or Firm* — Chen Yoshimura LLP

(57) ABSTRACT

The present application provides a detection method of metal impurity in wafer. The method comprises conducting a medium temperature thermal treatment for a first predicted time period to the wafer, cooling the wafer and conducting a low temperature thermal treatment for a second predicted time period, cooling the wafer to ambient temperature; providing a liquid of vapor phase decomposition on the wafer to collect metal impurities; atomizing the liquid containing the collected metal impurities, conducting an inductively coupled plasma mass spectrometry analysis and obtaining concentrations of the metal impurities. The present application applies the combination of various thermal treatment without an interrupt of cooling to ambient temperature to contemplate diffusions of various metal impurities to the wafer surface. Accordingly, the detection of metal impurities can be conducted with reduced time cost and enhanced efficiency.

17 Claims, 4 Drawing Sheets

(51) Int. Cl.
*H01J 49/10* (2006.01)
*H01L 21/66* (2006.01)

(56) References Cited

U.S. PATENT DOCUMENTS

| | | | |
|---|---|---|---|
| 9,437,505 B2 * | 9/2016 | Arai | ........................ C30B 25/16 |
| 11,075,070 B2 * | 7/2021 | Roettger | ................. H01L 22/20 |
| 2005/0250297 A1 | 11/2005 | Shive et al. | |
| 2009/0249863 A1 * | 10/2009 | Kim | .................. H01L 21/67126 |
| | | | 73/31.07 |

FOREIGN PATENT DOCUMENTS

| | | | | | |
|---|---|---|---|---|---|
| CN | 111863665 | A | * | 10/2020 | ....... H01L 21/67103 |
| JP | 3436123 | B2 | * | 8/2003 | |
| JP | 2014194031 | A | * | 10/2014 | |
| TW | 390963 | B | | 5/2000 | |

OTHER PUBLICATIONS

Chinese Office Action, dated Aug. 26, 2022, and Search Report dated Aug. 19, 2022, in a counterpart Chinese patent application, No. CN 202011581016.8.

* cited by examiner

DETECTION METHOD OF METAL IMPURITY IN WAFER

BACKGROUND OF THE INVENTION

1. Field of the Invention

The present invention relates to a manufacture of integrated circuits, and more particularly to detection of metal impurities in a wafer.

2. Description of the Related Art

Currently, semiconductor devices are developed with higher operation speed and smaller size. The density of the contained elements on a device is increasing with the reduced size of the device, causing the more strict requests for the quality of initial wafer (i.e. naked wafer without integrated circuit thereon). If the initial wafer contains metal impurities, defects appear in the following prepared semiconductor devices. Metal ion is a source of mobile ionic contamination, which has strong transportability. The mobile ionic contamination induces structural defects of oxide-polysilicon gate, increases PN junction leakage, reduces carrier lifetime, and changes valve voltage. The mobile ionic contamination seriously damages yield and reliability of semiconductor device. Therefore, the metal content of the initial wafer directly and significantly affects the qualified rate of the processing of semiconductor device.

Accordingly, the detection of metal impurities such as copper (Cu) and/or nickel (Ni) contained in the initial wafer is very important for quality control of the initial wafer.

SUMMARY

The purpose of the present application is to provide a detection method of metal impurity in wafer. The method can be applied to various metal impurities by making the metal impurities diffuse to the wafer surface. The method can reduce time cost and enhance efficiency.

The present application describes a method for detecting metal impurities in wafer comprising:
  conducting a medium temperature thermal treatment under 350° C.-550° C. for a first predicted time period to the wafer,
  cooling the wafer to a low temperature and conducting a low temperature thermal treatment under 200° C.-300° C. for a second predicted time period,
  cooling the wafer to ambient temperature,
  providing a liquid of vapor phase decomposition on the wafer surface to collect metal impurities therefrom, and atomizing the liquid containing the collected metal impurities, conducting an inductively coupled plasma mass spectrometry analysis, and obtaining concentrations of the metal impurities.

Further, the metal impurity comprises copper and/or nickel.

Further, the medium temperature thermal treatment is under 400° C.-500° C. for 3 minutes (min)-7 min.

Further, the nickel diffuses to the wafer surface during the medium temperature thermal treatment.

Further, the copper diffuses to the wafer surface during the low temperature thermal treatment.

Further, the wafer subjected to the medium temperature thermal treatment is naturally cooled down to the low temperature, and the wafer subjected to the low temperature thermal treatment is naturally cooled down to the ambient temperature.

Further, the first predicted time period is 2 min-30 min, and the second predicted time period is 120 min-180 min.

Further, the liquid of vapor phase decomposition comprises: hydrogen peroxide ($H_2O_2$), hydrofluoric acid (HF), nitric acid ($H_2NO_3$), ultrapure water and a scanning fluid.

Further, the liquid of vapor phase decomposition comprises: 35±1% of hydrogen peroxide, 38% of hydrofluoric acid, 68% of nitric acid, the ultrapure water with a resistivity ≥18 MΩ·cm, and the scanning fluid containing 1% of HF and 4% of $H_2O_2$.

Further, the wafer comprises a monocrystalline silicon wafer with a thickness of 300 μm to 1600 μm, doped with any of arsenic (As), phosphorus (P), antimony (Sb) and boron (B), with a crystal orientation <100> or <111>, and prepared by floating zone process or Czochralski process.

The present application provides a detection method of metal impurities in wafer. The method comprises conducting a medium temperature thermal treatment for a first predicted time period to the wafer, cooling the wafer and conducting a low temperature thermal treatment for a second predicted time period, cooling the wafer to ambient temperature; providing a liquid of vapor phase decomposition on the wafer to collect metal impurities therefrom; atomizing the liquid containing the collected metal impurities, conducting an inductively coupled plasma mass spectrometry analysis and obtaining concentrations of the metal impurities. The present application applies the combination of various thermal treatments without an interrupt of cooling to ambient temperature to contemplate diffusions of various metal impurities to the wafer surface. Accordingly, the detection of metal impurities can be conducted with reduced time cost and enhanced efficiency.

DETAILED DESCRIPTION OF THE EMBODIMENTS

Figure 1:
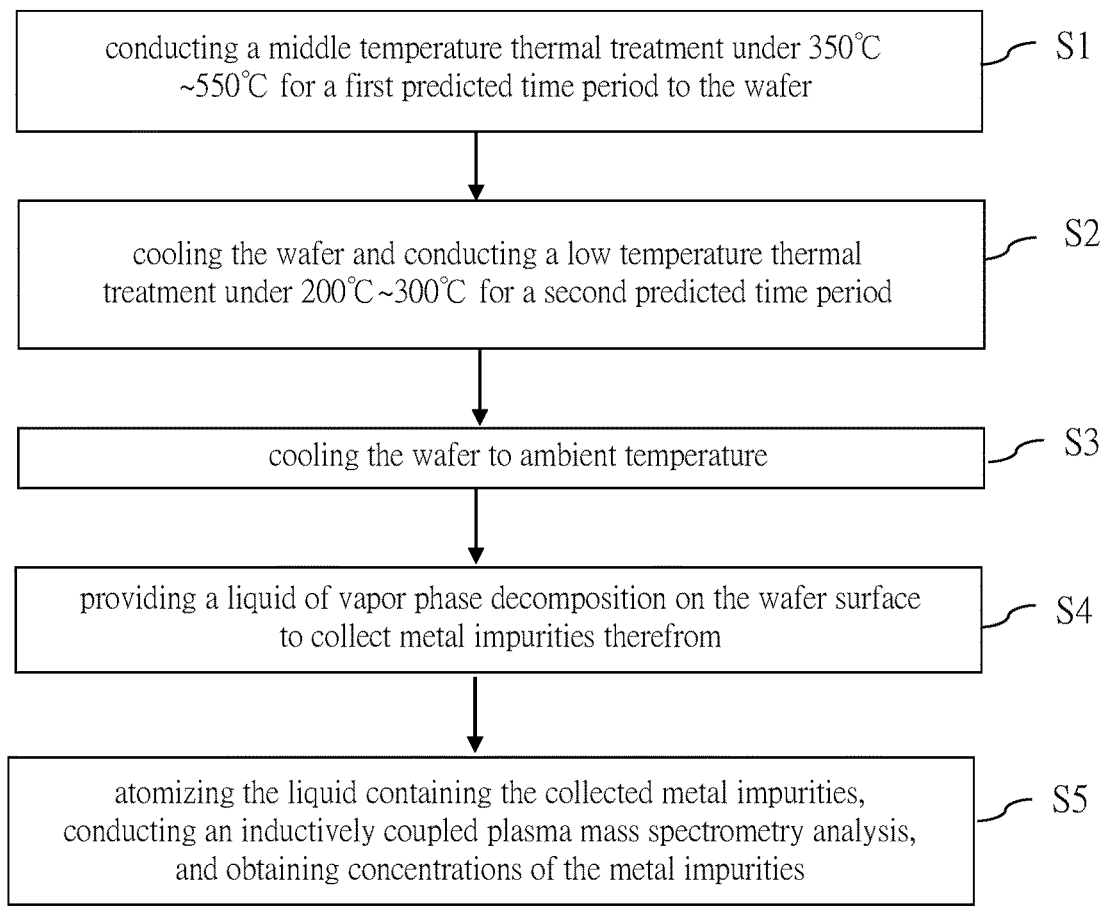
FIG. 1 is a flowchart illustrating method steps for detecting metal impurities in wafer.

As described in the background, it is important to control wafer quality by detection of metal impurities contained in wafer. The wafer mentioned in the present application means an initial wafer, i.e. bare wafer, which is not yet subjected to the integrated circuit manufacture process. The metal impurities contained in wafer mainly include copper (Cu) and/or nickel (Ni). The present application provides a method to detect metal impurities in a wafer, which steps are described as follows.

The wafer is subjected to low temperature thermal treatment, for example, under 250° C. for 150 min. It is observed that, under such low temperature thermal treatment, the metal impurity Ni has less diffusion to the wafer surface. However, under a medium temperature thermal treatment, for example, under 450° C. for 5 min, the metal impurity Ni has sufficient diffusion to the wafer surface. Experiments prove that, at the same concentration of the metal impurity Ni in the wafer, the diffusion amount of Ni at the medium temperature is 10-fold higher than that at the low temperature. Namely, the medium temperature condition is more suitable than the low temperature for Ni diffusion. However, Cu has less diffusion amount under the medium temperature condition but more diffusion amount under the low temperature condition. Namely, the better diffusion condition for Cu is distinct from that for Ni.

To ensure the sufficient collection of the metal impurities Cu and Ni to monitor wafer quality, the target wafer has to be heated at various thermal conditions. Detail steps are described as follows.

Step 1: a target wafer is subjected to a medium temperature thermal treatment, such as under 450° C. for 5 minutes, and then the wafer is cooled to ambient temperature. The concentration of Ni on the wafer surface is detected.

Step 2: the target wafer is subjected to a low temperature thermal treatment, such as under 250° C. for 150 minutes, and then the wafer is cooled to ambient temperature. The concentration of Cu on the wafer surface is detected.

The order of Step 1 and Step 2 is not limited.

Though the above method can be applied to detect the metal impurities Cu and Ni contained in the wafer, the method causes heavy workloads, large time cost and lower efficiency.

According to the above researches, the present application provides an improved method for detecting metal impurities in wafer. Example embodiments will now be described more fully with reference to the accompanying drawings. It should be understood that the present invention may be practiced in different forms and that neither should be construed to limit the scope of the disclosed examples. On the contrary, the examples are provided to achieve a full and complete disclosure and make those skilled in the art fully receive the scope of the present invention. In the drawings, for clarity purpose, the size and the relative size of layers and areas may be exaggerated. In the drawings, same reference number indicates same element.

In one embodiment of the present application, a method for detecting metal impurities in wafer is shown as FIG. 1. The method comprises the following steps.

Step 1: a wafer is subjected to a medium temperature thermal treatment, such as under 350° C.-550° C. for a first predicted time period.

Step 2: the wafer is then cooled to a low temperature and subjected to the low temperature thermal treatment, such as under 200° C.-300° C. for a second predicted time period.

Step S3: the wafer is then cooled to ambient temperature.

Step S4: a liquid of vapor phase decomposition is dropped on the wafer surface to collect metal impurities therefrom.

Step S5: the liquid containing the collected metal impurities is atomized and then subjected to an inductively coupled plasma mass spectrometry analysis. The concentrations of the metal impurities are obtained by calculations.

The metal impurities mainly include Cu and/or Ni, and may further include iron (Fe), chromium (Cr), manganese (Mn), lead (Pb) and the like.

The wafer (initial wafer) comprises, but not be limited to, a monocrystalline silicon wafer with a thickness of 300 μm to 1600 μm. The wafer may be doped with any of arsenic (As), phosphorus (P), antimony (Sb) and boron (B). The wafer has a crystal orientation <100> or <111>. The wafer may be prepared by, but not be limited to, floating zone process or Czochralski process. The wafer has a resistivity of $10^{-4}\Omega$ to $10^{4}\Omega$. The method of the present application is able to be applied to the concentration detection of ultra-trace metal ions on surface of the polished monocrystalline silicon wafers with various specifications. The polished wafer can be substrate for various semiconductor devices.

The wafer is subjected to a medium temperature thermal treatment, wherein the medium temperature thermal treatment comprises heating the wafer to 350° C.-550° C. and maintaining the temperature for a first predicted time period. The first predicted time period can be 2 min-30 min. Because of the thermal energy under the medium temperature thermal treatment, the metal impurity such as Ni in the wafer can break potential barrier and crystal lattice control to diffuse (i.e. ionized) to the wafer surface. In a preferred embodiment, the medium temperature thermal treatment is conducted under 400° C.-500° C. for 3 min-7 min.

After the medium temperature thermal treatment, the wafer is cooled to the low temperature such as 200° C.-300° C. via naturally cooling. The medium temperature thermal treatment may be conducted under 200° C.-300° C. for a second predicted time period. The second predicted time period can be 120 min-180 min Because of the thermal energy under the low temperature thermal treatment, the metal impurity such as Cu in the wafer can break potential barrier and crystal lattice control to diffuse (i.e. ionized) to the wafer surface.

The present application applies the combination of the above thermal treatment, i.e. the medium temperature thermal treatment and the following low temperature thermal treatment, without an interrupt of cooling to ambient temperature to make the metal impurities Cu and/or Ni distributed within the wafer diffuse to the wafer surface. Then the wafer is cooled to ambient temperature.

On scanning platform of inductively coupled plasma mass spectrometry (ICPMS), a scanning tube absorbs the liquid of vapor phase decomposition (VPD) dropped on the wafer to collect the metal impurities on the wafer surface. The VPD liquid containing the collected metal impurities is atomized and subjected to the inductively coupled plasma mass spectrometry analysis. The concentrations of the metal impurities can be calculated and obtained accordingly.

ICPMS is a technical analysis for plural elements with excellent sensitivity and high analysis efficiency. ICPMS is able to detect most elements in Periodic Table of Elements simultaneously, and its detection level can be lowered to several ng/l or ppt.

The drop of VPD liquid moves through the wafer surface to collect metals on the wafer surface. The residual of VPD liquid can be eliminated by tilting the wafer and using the drop's gravity. The VPD liquid comprises hydrogen peroxide, hydrofluoric acid, nitric acid, ultrapure water, and scanning fluid. In one embodiment, the VPD liquid comprises 35±1% of hydrogen peroxide ($H_2O_2$), 38% of hydrofluoric acid (HF), 68% of nitric acid ($HNO_3$), the ultrapure water with a resistivity ≥18 MΩ·cm, and the scanning fluid containing 1% of HF and 4% of $H_2O_2$.

Experimental tests prove the capability and the efficiency of the method in the present application to detect metal impurities. FIG. 2 to FIG. 7 show the detected concentrations of the metal impurities Cu and Ni in wafer by applying various thermal treatments. Two types of wafers are used for the test, i.e. the type A of wafer and the type B of wafer. Three wafers of type A, i.e. A1, A2 and A3 and three wafers of type B, i.e. B1, B2 and B3 are used for the test.

It should be understood that the metal concentration of the same type wafers is known and identical. Different thermal treatments cause different results of diffusion of the same metal. The detected concentration of the metal on the wafer surface is higher while the diffusion of the metal induced by the thermal treatment is more. Namely, for the same wafer, the thermal treatment causing more metal diffusion is more suitable for the detection of metal impurities.

Figure 2:
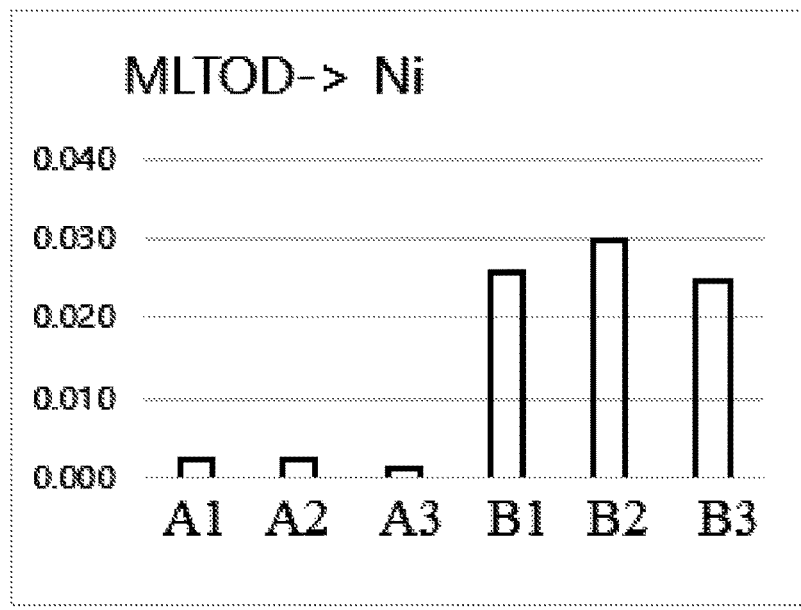
FIG. 2 to FIG. 7 show the detected concentrations of the metal impurities in wafer by applying various thermal treatments.
Figure 3:
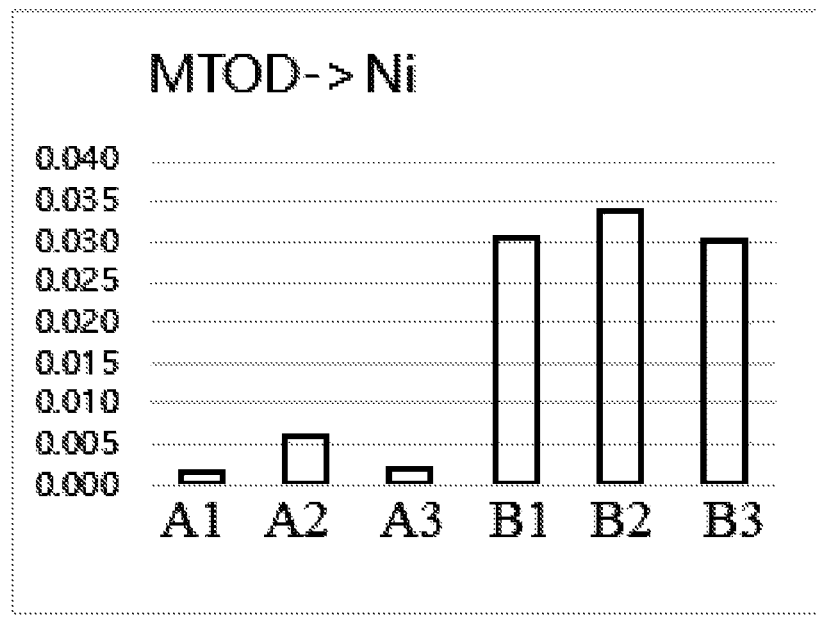
Figure 4:
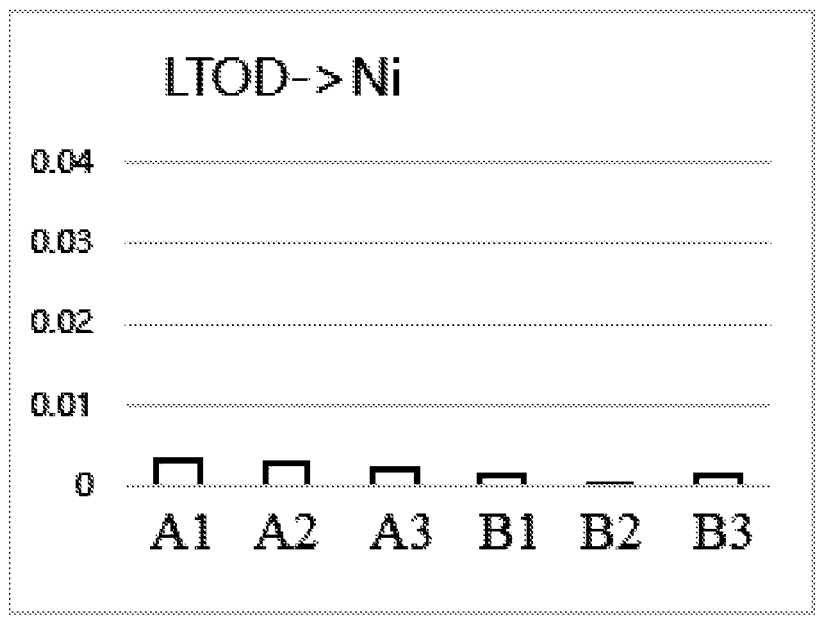

FIG. 2 to FIG. 4 show the detected Ni concentrations in the two types of wafers by applying various thermal treatments. In FIG. 2 to FIG. 4, the y-axis is Ni concentration with the unit $10^{10}$ atoms/cm$^2$ and the x-axis is the wafer type. FIG. 2 represents the method of the present application, i.e. middle and low temperature of diffusion (MLTOD) process. MLTOD means the combination of the thermal treatments including the medium temperature and then the low temperature thermal treatments without an interrupt of cooling to ambient temperature. In FIG. 3, the x-axis shows the wafer type, and the y-axis is Ni concentration detected under the medium temperature of diffusion (MTOD) process. The MTOD process is the thermal treatment at 450° C. for 5 min. In FIG. 4, the x-axis shows the wafer type, and the y-axis is Ni concentration detected under the low temperature of diffusion (LTOD) process. The LTOD process is the thermal treatment at 250° C. for 150 min.

As shown in FIG. 2 to FIG. 4, the Ni concentration detected under the MTOD process of FIG. 3 is higher, while the Ni concentration detected under the LTOD process of FIG. 4 is lower. For the second type of wafers (B1, B2 and B3), the differences of the Ni concentration between the thermal treatments are more significant. The results prove that the medium temperature is more suitable for Ni diffusion. In addition, the Ni concentration detected under the MLTOD process of FIG. 2 is similar (very close) to that of FIG. 3. Accordingly, the MLTOD process combines the thermal treatments, reduces the time cost, enhances the test efficiency and ensures the detection quality.

Figure 5:
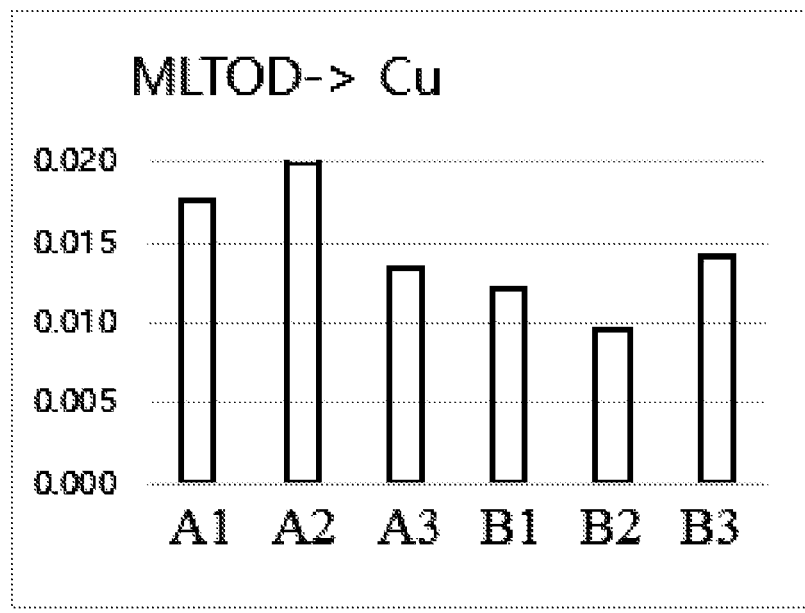
Figure 6:
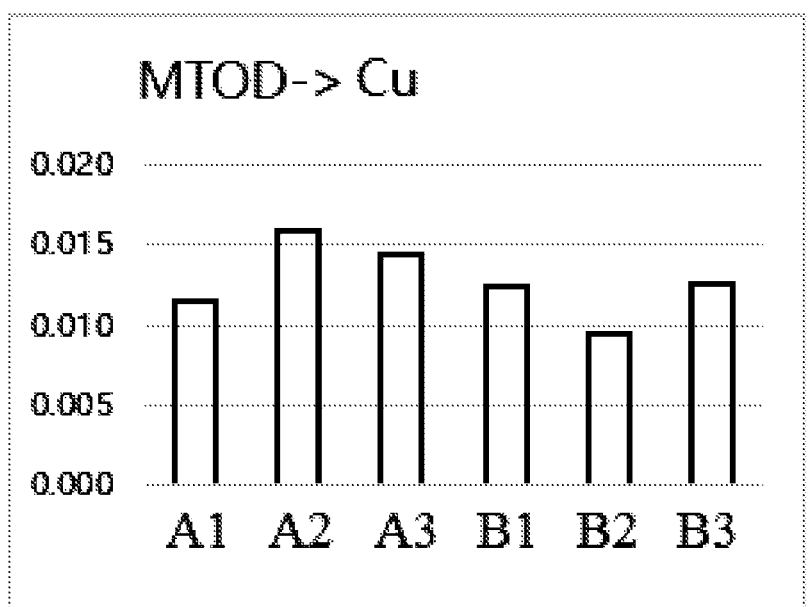
Figure 7:
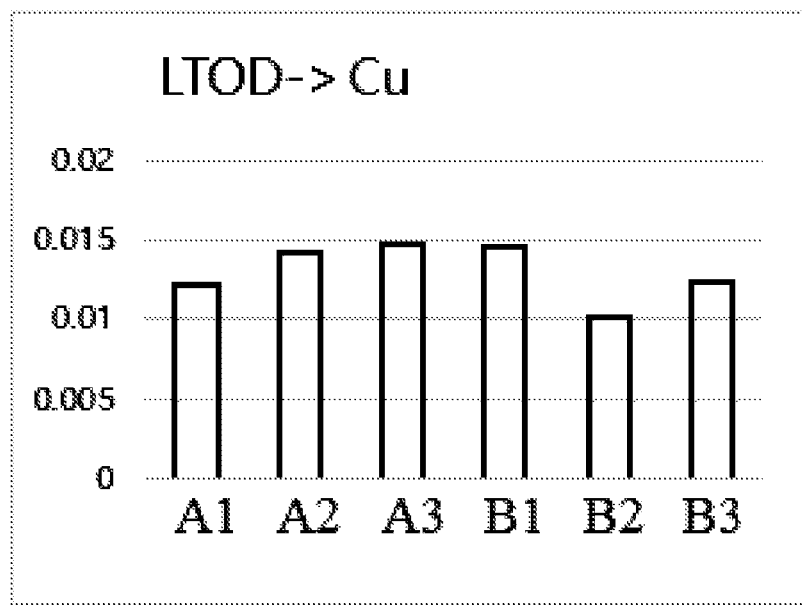

FIG. 5 to FIG. 7 show the detected Cu concentrations in the two types of wafers by applying various thermal treatments. The wafers are the same with that of Ni detection. In FIG. 5 to FIG. 7, the y-axis is Cu concentration with the unit $10^{10}$ atoms/cm$^2$ and the x-axis is the wafer type. Two types of wafers are used for the test, i.e. the type A of wafer and the type B of wafer. Three wafers of type A, i.e. A1, A2 and A3 and three wafers of type B, i.e. B1, B2 and B3 are used for the test. In FIG. 5, the x-axis shows the wafer type, and the y-axis is Cu concentration detected under the middle and low temperature of diffusion (MLTOD) process. FIG. 5 represents the method of the present application, i.e. the MLTOD process. MLTOD means the combination of the thermal treatments including the medium temperature and then the low temperature thermal treatments without an interrupt of cooling to ambient temperature.

In FIG. 6, the x-axis shows the wafer type, and the y-axis is Cu concentration detected under the medium temperature of diffusion (MTOD) process. The MTOD process is the thermal treatment at 450° C. for 5 min.

In FIG. 7, the x-axis shows the wafer type, and the y-axis is Cu concentration detected under the low temperature of diffusion (LTOD) process. The LTOD process is the thermal treatment at 250° C. for 150 min.

As shown in FIG. 5 to FIG. 7, the Cu concentration detected under the MLTOD process of FIG. 5 is higher than that of MTOD process of FIG. 6. The Cu concentration detected under the MLTOD process of FIG. 5 is higher than that of LTOD process of FIG. 7. According to the results, the MLTOD process combines the thermal treatments, reduces the time cost, enhances the test efficiency and ensures the detection quality.

Referring FIG. 2 to FIG. 7, comparing the known detection process (i.e. Step 1: conducting the middle thermal treatment at 450° C. for 5 min, cooling to ambient temperature and detecting Ni concentration on the wafer surface, and Step 2: conducting the low thermal treatment at 250° C. for 150 min, cooling to ambient temperature and detecting Cu concentration on the wafer surface), the method for detecting metal impurities in wafer of the present application provides the combination of the thermal treatments without an interrupt of cooling to ambient temperature. The method of the present application is able to contemplate the diffusions of different metals, i.e. the medium temperature thermal treatment for the Ni diffusion and the low temperature thermal treatment for the Cu diffusion. Accordingly, the time cost of the detection can be reduced, and the efficiency of the detection can be enhanced.

According to the above, the present application provides a detection method of metal impurities in wafer. The method comprises conducting a medium temperature thermal treatment for a first predicted time period to the wafer, cooling the wafer and conducting a low temperature thermal treatment for a second predicted time period, cooling the wafer to ambient temperature; providing a liquid of vapor phase decomposition on the wafer to collect metal impurities therefrom; atomizing the liquid containing the collected metal impurities, conducting an inductively coupled plasma mass spectrometry analysis and obtaining concentrations of the metal impurities. Specifically, the medium temperature thermal treatment is under 350° C.-550° C., and the low temperature thermal treatment is under 200° C.-300° C. The present application applies the combination of various thermal treatments without an interrupt of cooling to ambient temperature to contemplate diffusions of various metal impurities to the wafer surface. Accordingly, the detection of metal impurities can be conducted with reduced time cost and enhanced efficiency.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims and its equivalent systems and methods.

What is claimed is:

1. A method for detecting metal impurities in wafer comprising:
    conducting a medium temperature thermal treatment under 350° C.-550° C. for a first predicted time period to the wafer,
    cooling the wafer to a low temperature and conducting a low temperature thermal treatment under 200° C.-300° C. for a second predicted time period,
    cooling the wafer to ambient temperature,
    providing a liquid of vapor phase decomposition on the wafer surface to collect metal impurities therefrom, and
    atomizing the liquid containing the collected metal impurities, conducting an inductively coupled plasma mass spectrometry analysis, and obtaining concentrations of the metal impurities,
    wherein the metal impurity comprises copper and nickel, the nickel diffuses to the wafer surface during the medium temperature thermal treatment, and the copper diffuses to the wafer surface during the low temperature thermal treatment.

2. The method of claim 1, wherein the medium temperature thermal treatment is under 400° C.-500° C. for 3 minutes (min)-7 min.

3. The method of claim 1, wherein the wafer subjected to the medium temperature thermal treatment is naturally cooled down to the low temperature, and the wafer subjected to the low temperature thermal treatment is naturally cooled down to the ambient temperature.

4. The method of claim 1, wherein the first predicted time period is 2 min-30 min, and the second predicted time period is 120 min-180 min.

5. The method of claim 1, wherein the liquid of vapor phase decomposition comprises hydrogen peroxide, hydrofluoric acid, nitric acid, ultrapure water, and a scanning fluid.

6. The method of claim 5, wherein the liquid of vapor phase decomposition comprises 35±1% of hydrogen peroxide, 38% of hydrofluoric acid, 68% of nitric acid, ultrapure water with a resistivity ≥18 MΩ·cm, and the scanning fluid containing 1% of HF and 4% of $H_2O_2$.

7. The method of claim 1, wherein the wafer comprises a monocrystalline silicon wafer with a thickness of 300 μm to 1600 μm, doped with any of arsenic (As), phosphorus (P), antimony (Sb) and boron (B), with a crystal orientation <100> or <111>, and prepared by floating zone process or Czochralski process.

8. A method for detecting metal impurities in wafer comprising:
conducting a medium temperature thermal treatment under 350° C.-550° C. for a first predicted time period to the wafer,
cooling the wafer to a low temperature and conducting a low temperature thermal treatment under 200° C.-300° C. for a second predicted time period,
cooling the wafer to ambient temperature,
providing a liquid of vapor phase decomposition on the wafer surface to collect metal impurities therefrom, and
atomizing the liquid containing the collected metal impurities, conducting an inductively coupled plasma mass spectrometry analysis, and obtaining concentrations of the metal impurities;
wherein the first predicted time period is 2 min-30 min, and the second predicted time period is 120 min-180 min.

9. The method of claim 8, wherein the metal impurity comprises copper and/or nickel.

10. The method of claim 8, wherein the medium temperature thermal treatment is under 400° C.-500° C. for 3 minutes (min)-7 min.

11. The method of claim 8, wherein the wafer subjected to the medium temperature thermal treatment is naturally cooled down to the low temperature, and the wafer subjected to the low temperature thermal treatment is naturally cooled down to the ambient temperature.

12. The method of claim 8, wherein the liquid of vapor phase decomposition comprises hydrogen peroxide, hydrofluoric acid, nitric acid, ultrapure water, and a scanning fluid.

13. A method for detecting metal impurities in wafer comprising:
conducting a medium temperature thermal treatment under 350° C.-550° C. for a first predicted time period to the wafer,
cooling the wafer to a low temperature and conducting a low temperature thermal treatment under 200° C.-300° C. for a second predicted time period,
cooling the wafer to ambient temperature,
providing a liquid of vapor phase decomposition on the wafer surface to collect metal impurities therefrom, and
atomizing the liquid containing the collected metal impurities, conducting an inductively coupled plasma mass spectrometry analysis, and obtaining concentrations of the metal impurities,
wherein the liquid of vapor phase decomposition comprises 35±1% of hydrogen peroxide, 38% of hydrofluoric acid, 68% of nitric acid, ultrapure water with a resistivity ≥18 MΩ·cm, and the scanning fluid containing 1% of HF and 4% of $H_2O_2$.

14. The method of claim 13, wherein the metal impurity comprises copper and/or nickel.

15. The method of claim 13, wherein the medium temperature thermal treatment is under 400° C.-500° C. for 3 minutes (min)-7 min.

16. The method of claim 13, wherein the wafer subjected to the medium temperature thermal treatment is naturally cooled down to the low temperature, and the wafer subjected to the low temperature thermal treatment is naturally cooled down to the ambient temperature.

17. The method of claim 13, wherein the first predicted time period is 2 min-30 min, and the second predicted time period is 120 min-180 min.

* * * * *